United States Patent
Olsen et al.

(10) Patent No.: US 9,482,382 B2
(45) Date of Patent: Nov. 1, 2016

(54) HOLDING DEVICE FOR A TABLET COMPUTER

(71) Applicant: Esselte Leitz GmbH & Co KG, Stuttgart (DE)

(72) Inventors: Arild Olsen, Leonberg (DE); Kurt Leute, Blumberg (DE); Ulrich Schneider, Stuttgart (DE)

(73) Assignee: Esselte Leitz GmbH & Co KG, Stuttgart (DE)

( * ) Notice: Subject to any disclaimer, the term of this patent is extended or adjusted under 35 U.S.C. 154(b) by 0 days.

(21) Appl. No.: 14/420,034

(22) PCT Filed: Jul. 16, 2013

(86) PCT No.: PCT/EP2013/064976
§ 371 (c)(1),
(2) Date: Feb. 6, 2015

(87) PCT Pub. No.: WO2014/023528
PCT Pub. Date: Feb. 13, 2014

(65) Prior Publication Data
US 2015/0223354 A1  Aug. 6, 2015

(30) Foreign Application Priority Data
Aug. 7, 2012 (DE) .................. 10 2012 015 484

(51) Int. Cl.
*F16M 11/08* (2006.01)
*G06F 1/16* (2006.01)
(Continued)

(52) U.S. Cl.
CPC ........... *F16M 11/08* (2013.01); *E05B 73/0082* (2013.01); *F16M 11/04* (2013.01);
(Continued)

(58) Field of Classification Search
CPC . G06F 1/1632; E05B 73/0082; F16M 11/08; F16M 11/2014; F16M 11/04
See application file for complete search history.

(56) References Cited

U.S. PATENT DOCUMENTS 5,971,268 A * 10/1999 Lynch .................... F16M 11/10
235/1 R
D512,066 S * 11/2005 Solomon ...................... D14/434
(Continued)

FOREIGN PATENT DOCUMENTS

DE  44 00 305 A1  7/1995
DE  195 31 866 C1  2/1997
(Continued)

OTHER PUBLICATIONS

International Search Report of PCT/EP2013/064976, mailed Oct. 24, 2013.
(Continued)

*Primary Examiner* — Eret McNichols
(74) *Attorney, Agent, or Firm* — Collard & Roe, P.C.

(57) ABSTRACT

A holding device for a tablet computer has a lower part spanning a setting-up surface for setting it up on a tabletop and an upper part which can be rotated with respect to the lower part about a rotation axis extending substantially perpendicularly to the setting-up surface, which upper part has a first and a second bearing surface for the tablet computer, wherein each of the bearing surfaces defines a position of the tablet computer in which it is inclined at an acute angle to the setting-up surface, and wherein the tablet computer in the position defined by the first bearing surface is inclined at a greater angle to the setting-up surface than in the position defined by the second bearing surface.

9 Claims, 5 Drawing Sheets

Figure 1A:
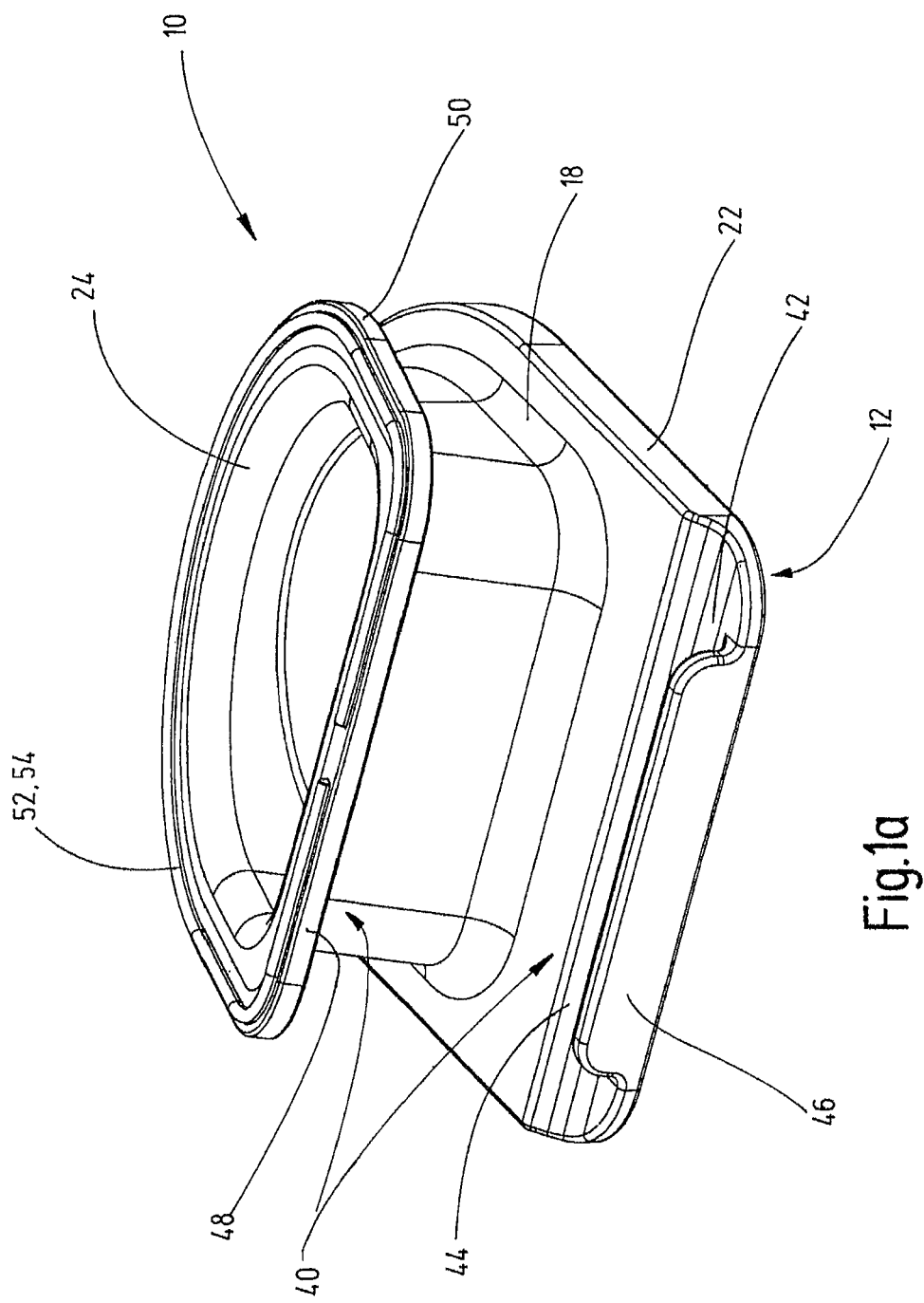

(51) Int. Cl.
*E05B 73/00* (2006.01)
*F16M 11/10* (2006.01)
*F16M 13/00* (2006.01)
*F16M 11/04* (2006.01)
*F16M 11/20* (2006.01)
*H05K 5/02* (2006.01)

(52) U.S. Cl.
CPC ......... *F16M 11/10* (2013.01); *F16M 11/2014* (2013.01); *F16M 13/00* (2013.01); *G06F 1/1626* (2013.01); *G06F 1/1632* (2013.01); *H05K 5/0204* (2013.01)

(56) References Cited

U.S. PATENT DOCUMENTS

| | | | |
|---|---|---|---|
| 8,282,060 B2 | 10/2012 | Fan | |
| D687,832 S * | 8/2013 | Edwards | D14/447 |
| D707,685 S * | 6/2014 | Johnson | D14/447 |
| D718,770 S * | 12/2014 | Specht | D14/447 |
| D727,329 S * | 4/2015 | Johnson | D14/434 |
| 9,058,727 B2 * | 6/2015 | Edwards | E05B 65/461 |
| 9,163,433 B2 * | 10/2015 | Sedon | E05B 73/0082 |
| 9,257,018 B2 * | 2/2016 | Edwards | E05B 65/461 |
| 9,267,642 B2 * | 2/2016 | Enkerlin | F16M 11/10 |
| 2004/0043650 A1 * | 3/2004 | Yang | G06F 1/1626 439/165 |
| 2005/0268673 A1 * | 12/2005 | Bakker | A47B 23/04 70/58 |
| 2012/0075789 A1 * | 3/2012 | DeCamp | F16M 11/041 361/679.26 |
| 2013/0155595 A1 * | 6/2013 | Herring | G07G 1/0018 361/679.21 |
| 2013/0202269 A1 * | 8/2013 | Rossiter | G06F 1/1626 386/230 |
| 2013/0320177 A1 * | 12/2013 | Chen | F16M 11/10 248/371 |
| 2014/0361141 A1 * | 12/2014 | Coleman | H05K 5/0217 248/550 |
| 2014/0362517 A1 * | 12/2014 | Moock | E05B 73/0082 361/679.43 |
| 2015/0034778 A1 * | 2/2015 | Lin | G06F 1/1632 248/124.1 |
| 2015/0083615 A1 * | 3/2015 | Lay | F16M 11/00 206/45.24 |
| 2015/0208826 A1 * | 7/2015 | Yang | E05B 73/0082 248/551 |
| 2015/0241919 A1 * | 8/2015 | Beatty | G06F 1/1632 361/679.44 |

FOREIGN PATENT DOCUMENTS

| | | |
|---|---|---|
| DE | 20 2010 010 388 U1 | 12/2010 |
| DE | 20 2011 105 156 U1 | 11/2011 |
| DE | 20 2011 102 783 U1 | 12/2011 |
| WO | 2012/042317 A1 | 4/2012 |
| WO | 2012/054976 A1 | 5/2012 |
| WO | 2012/094526 A1 | 7/2012 |

OTHER PUBLICATIONS

German Search Report in DE 10 2012 015 484.4, dated May 13, 2013, with English translation of relevant parts.
Response to European Patent Office of the International Search Authority in PCT/EP2013/064976 dated May 21, 2014, with English translation of relevant parts.

* cited by examiner

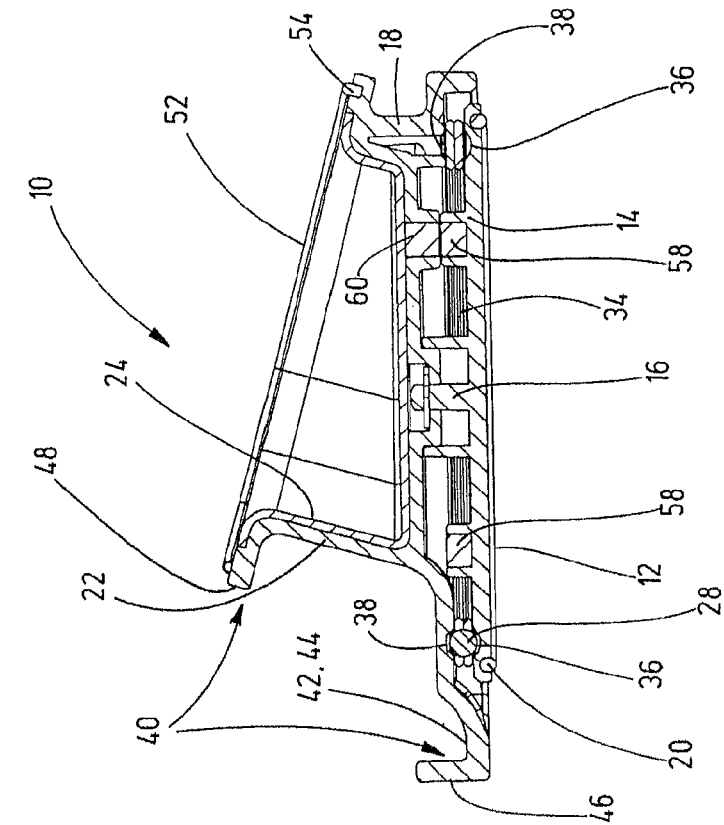
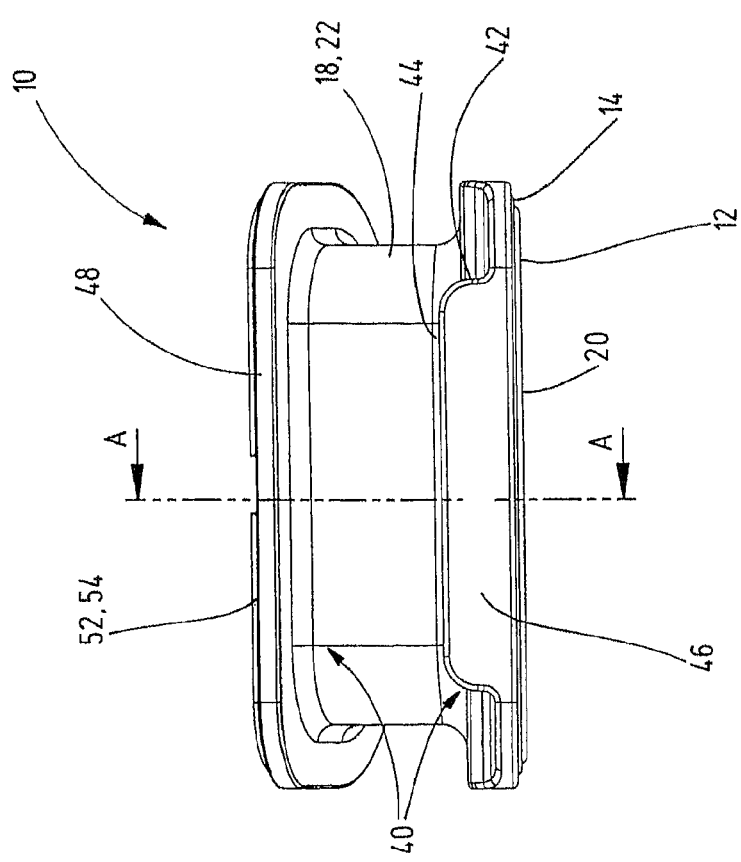

HOLDING DEVICE FOR A TABLET COMPUTER

CROSS REFERENCE TO RELATED APPLICATIONS

This application is the National Stage of PCT/EP2013/064976 filed on Jul. 16, 2013, which claims priority under 35 U.S.C. §119 of German Application No. 10 2012 015 484.4 filed on Aug. 7, 2012, the disclosure of which is incorporated by reference. The international application under POT article 21(2) was not published in English.

The invention relates to a holding apparatus for a tablet computer.

Tablet computers are finding ever broader use, because they are easy to handle, due to their light construction and their touch screen, and allow working on the computer even when traveling, when there is little room available. In general, a tablet computer is either placed on a table surface by the user or held in his/her hand. Under some circumstances, however, this can be impractical or uncomfortable.

WO 2012/054976 A1 shows a holding apparatus as named above which makes possible different positions of the tablet computer with different angles of inclination toward the horizontal.

It is therefore the task of the invention to create a holding apparatus for a flat object, such as, for example, a tablet computer, which apparatus simplifies operation of the tablet computer.

This task is accomplished, according to the invention, by means of a holding apparatus having the characteristics of claim 1.

Advantageous further developments of the invention are the object of the dependent claims.

The invention is based on the idea of creating a holding apparatus for a tablet computer, with which the latter can be set up on a table surface in two defined positions, so that its operation is simplified. In this connection, it should be inclined, in the first position, which is defined by a first contact surface, at a greater angle from the table surface, and stand practically upright, so that reading of the screen is simplified. In the second position, which is defined by a second contact surface, it should be inclined only slightly relative to the table surface, in other words be disposed almost horizontally, with a slight incline toward the user, so that the latter can easily operate the touch screen and write. The ability of the upper part to rotate relative to the lower part offers an additional function. In this way, the tablet computer can be rotated toward another person for demonstration purposes, for example during a meeting, so that this person can easily look at its screen.

It is preferred that the first contact surface, which allows extensively upright positioning of the tablet computer, is configured not as a continuous surface, but rather has two portions disposed at a distance from one another. In this connection, the first portion is the inner surface of a channel, and the second portion is disposed at a greater height above the setup surface than the first portion. Thereby the tablet computer is positioned in the channel with its lower edge, and leaned against the second portion with its rear side. It remains in this position as a result of the positioning of the lower edge in the channel, without having to be held in place. It is practical if the first contact surface is adapted to the size of a commercially available tablet computer, in that the second portion is disposed at a distance of at least 45 mm and at most 60 mm from the first portion.

It is furthermore preferred that the second contact surface is formed by an upper delimitation surface of the upper part. The touch screen of the tablet computer is then easily accessible for writing work. In this connection, the second contact surface preferably has a slip-preventing rubber element, so that the tablet computer remains lying in its position without having to be held in place. It is practical if the second contact surface is coordinated with the dimensions of a commercially available tablet computer, and has a length of 50 mm to 80 mm and a width of 60 mm to 100 mm.

The ability of the upper part to rotate relative to the lower part is preferably achieved by means of a ball bearing that has a ring provided with balls, between the upper part and the lower part, disposed at a distance from the upper part and the lower part, wherein the balls lie on the lower part and wherein the upper part lies on the balls. The ball bearing guarantees easy rotatability of the upper part relative to the lower part. It is practical if the lower part and the upper part each have a circumferential depression in which the balls are accommodated.

The holding apparatus has a locking device by means of which the upper part can be locked, relative to the lower part, in at least one preferred position. As a result, the upper part is prevented from rotating relative to the lower part in uncontrolled manner. It is practical if the locking device has at least one ferromagnetic element in the lower part and at least one ferromagnetic element in the upper part, wherein at least one of the ferromagnetic elements is a permanent magnet and wherein, in the at least one preferred position, a ferromagnetic element in the upper part is directly disposed above a ferromagnetic element in the lower part, forming a magnetic attraction force. The magnetic attraction force then has to be overcome in order to rotate the upper part out of the preferred position relative to the lower part.

Figure 2:
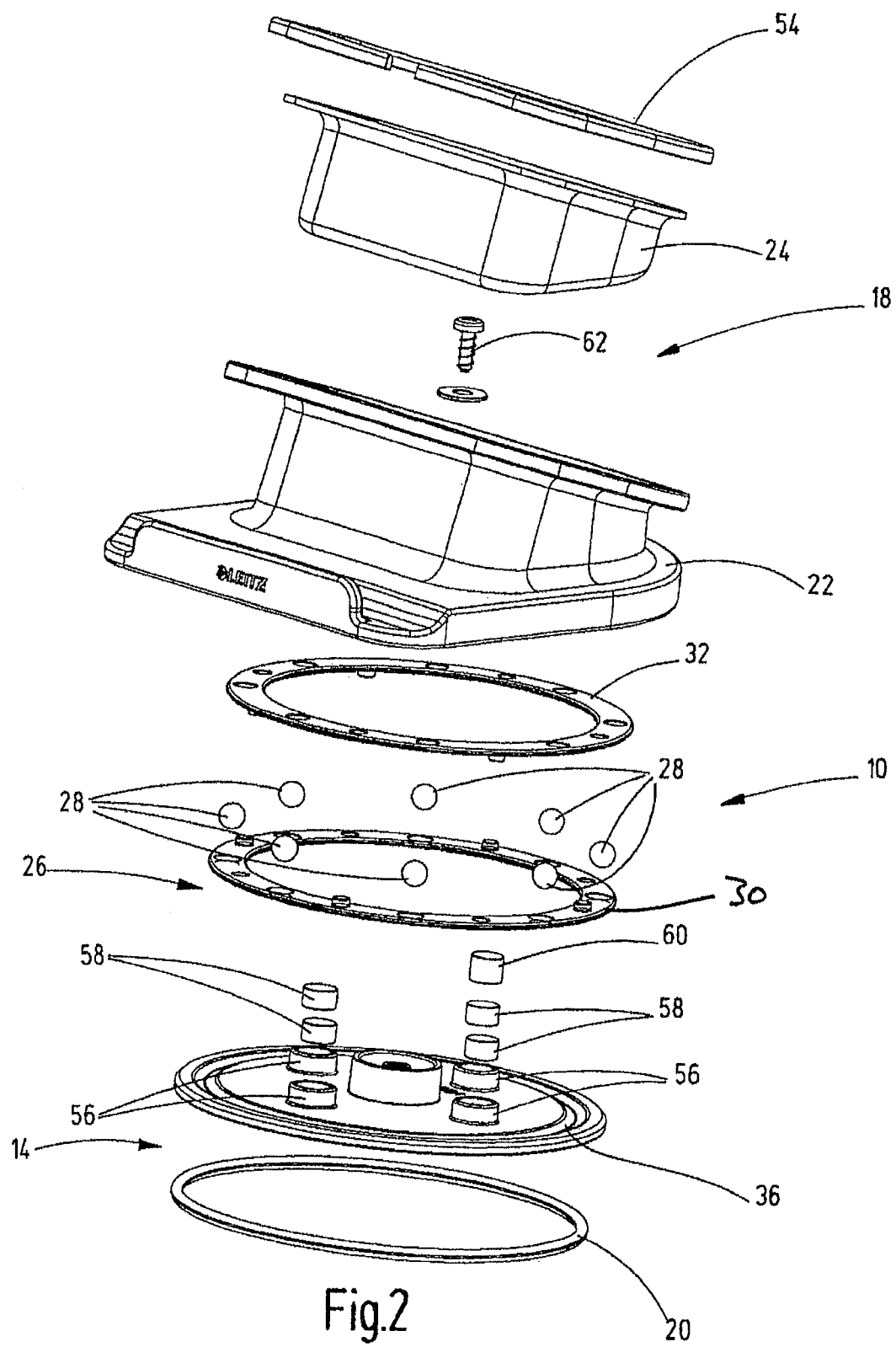

In the following, the invention will be explained in greater detail using an exemplary embodiment shown schematically in the drawing. The drawing shows:

FIG. 1a to 1c a holding apparatus in a perspective view, in a front view, and in section along the line A-A;

FIG. 2 an exploded view of the holding apparatus according to FIG. 1a to 1c, and FIG. 3a, 3b the holding apparatus with a tablet computer on the first contact surface and on the second contact surface, respectively.

The holding apparatus 10 shown in the drawing has lower part 14 that spans a setup surface 12 for setting the apparatus up on a table surface, as well as an upper part 18 mounted on the lower part 14 so as to rotate about an axis of rotation 16. Furthermore, a rubber ring 20 is fitted into the setup surface 12, which ring is supposed to prevent slipping of the holding apparatus 10 on a table surface. The upper part 18 has a base body 22 and an insert 24 inserted into the base body 22 and increasing the stability of the upper part 18, which body and insert are produced in one piece, in each instance, as injection-molded parts made of plastic, just like the lower part 14. A ball bearing 26 is disposed between the lower part 14 and the upper part 18, which has eight balls 28 in the exemplary embodiment shown, which are accommodated in a cage in the form of a ring 34 composed of two partial rings 30, 32 that are welded to one another and made of plastic, between the partial rings 30, 32. The balls 28 rest in a circumferential, circular depression 36 of the lower part 14, so that the ring 34 is constantly held at a distance from the lower part 14. The upper part 18 also has a circular circumferential depression 38, into which the balls engage, so that the upper part 18 rests on the balls 28 and the ring 34 is also held at a distance from the upper part 18.

Figure 3A:
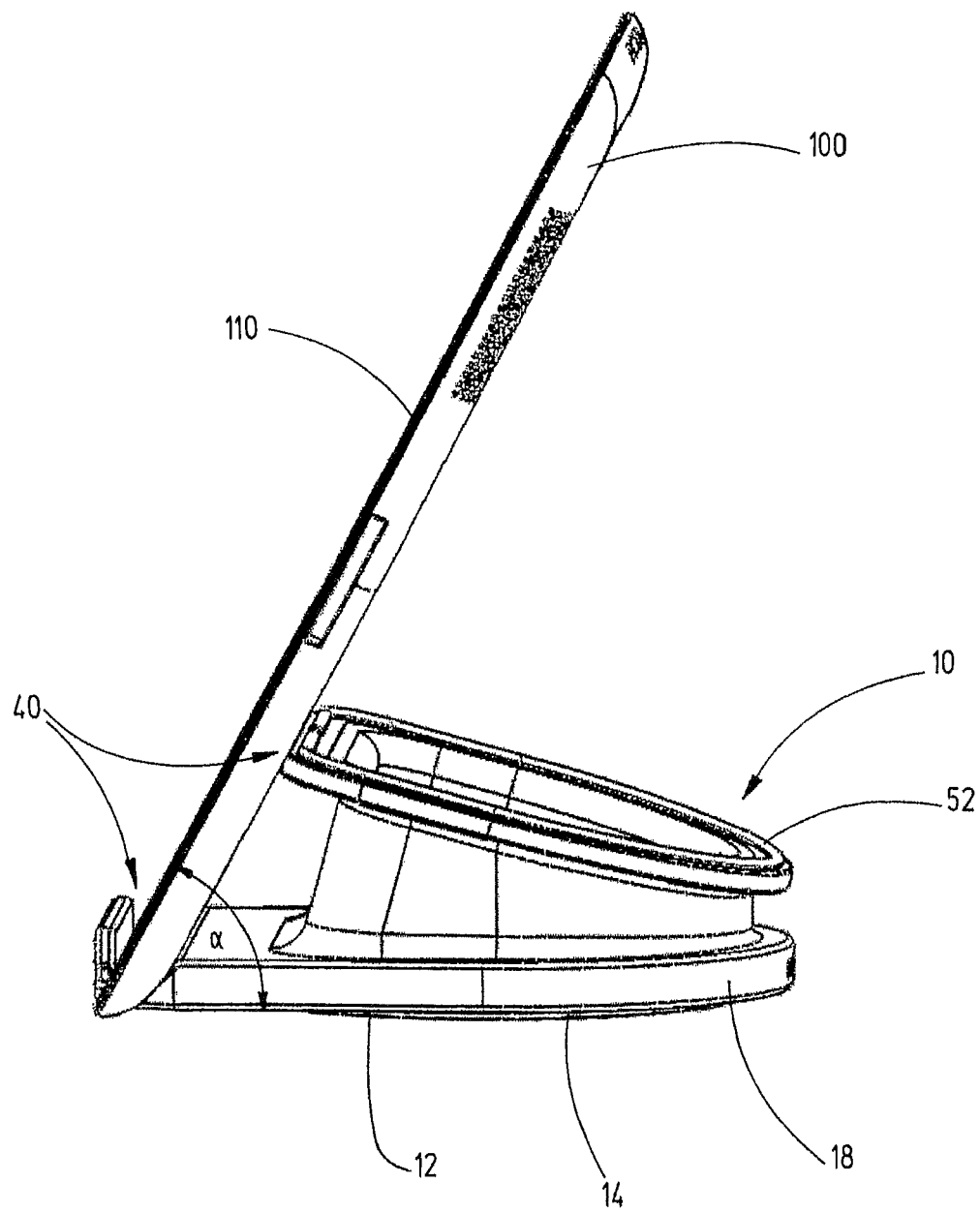

The upper part 18 has a first contact surface 40 for a tablet computer 100, which is divided up into two portions disposed at a distance from one another. A first portion 42 is formed by the inner surface of a channel 44 in the lower region of the upper part 18, which channel is delimited, on the side facing away from the axis of rotation 16, by a stop strip 46 that stands vertically upward. A second portion of the first contact surface 40 is formed by the front side 48 of a circumferential edge 50, facing the channel 44, in the upper region of the upper part 18. The tablet computer can be accommodated in the holding apparatus 10 in such a manner that a lower edge is accommodated in the channel 44, while its rear side lies against the second portion 48 of the first contact surface 40. The tablet computer is thereby held to stand almost upright in a first position, as shown in FIG. 3a, and its touch screen encloses an angle α of approximately 60° to 65° with the setup surface 12.

Figure 3B:
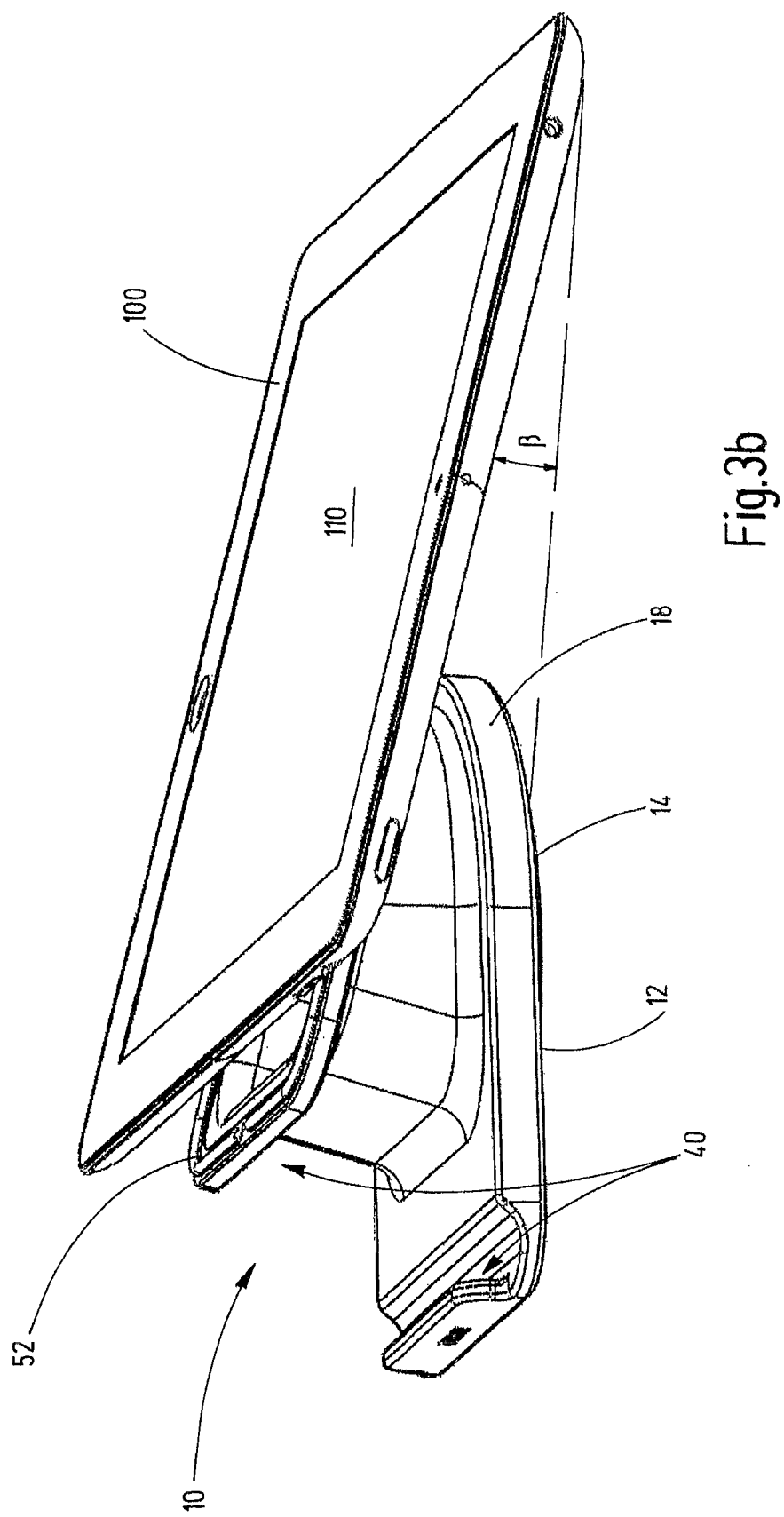

A second contact surface 52 is formed by an upper delimitation surface of the upper part 18, which has a rubber element 54 in the present exemplary embodiment. The second contact surface 52 is inclined by an angle β of approximately 15° relative to the setup surface 12. The tablet computer 100 can be laid onto the second contact surface 52 in a second position, as shown in FIG. 3b. In this connection, it projects downward so far that its lower edge lies on the table surface, not shown in FIG. 3b.

However, it is also possible that the tablet computer 100 is laid onto the second contact surface 52 in such a manner that its lower edge is disposed at a distance from the table surface. The touch screen 110 of the tablet computer 100 is then inclined only by the angle β of approximately 15° relative to the setup surface 12 and thereby relative to the table surface, so that it can easily be operated.

In this connection, the dimensions of the contact surfaces 40, 52 are coordinated with the size of the tablet computer 100. The first contact surface 40 is characterized in that the first portion 42 and the second portion 48 are disposed at a distance of approximately 50 mm from one another. The second contact surface 52 has a length of approximately 65 mm and a width of approximately 75 mm.

The lower part 14 is provided with four accommodation pockets 56 on its top, disposed at angular distances as well as equal distances from the axis of rotation 16, which pockets each accommodate a permanent magnet 58. Furthermore, a permanent magnet 60 is inserted into the base body 22 of the upper part 18. All the magnets 58, 60 face upward with the same pole, so that the magnet 60 in the upper part 18 experiences an attraction force when it is disposed above one of the four magnets 58 in the lower part 14. Thereby four preferred positions of the upper part 18 relative to the lower part 14 are defined, from which the upper part 18 can be rotated relative to the lower part 14 only by applying a force. The upper part 18 is attached to the lower part 14, so as to rotate, by means of a screw 62 through which the axis of rotation 16 runs, so that it is fixed in place on the lower part 14 in the axial direction. It is self-evident that the permanent magnets 58 in the lower part 14 can also be replaced with other elements composed of ferromagnetic material, which are not permanent magnets, having a corresponding size, for example composed of soft iron. Alternatively, the permanent magnet 60 in the upper part 18 can also be replaced with another ferromagnetic element that is not a permanent magnet and having a corresponding size. In both cases, a magnetic attraction force is achieved in the preferred positions, just as in the case of the configuration of all the ferromagnetic elements as permanent magnets 58, 60.

In summary, the following should be stated: The invention relates to a holding apparatus 10 for a tablet computer 100, having a lower part 14 that spans a setup surface 12 for setting the apparatus up on a table surface and having an upper part 18 that can rotate relative to the lower part 14, about an axis of rotation 16 that runs essentially perpendicular to the setup surface 12, which part has a first and a second contact surface 40, 52 for the tablet computer 100, wherein each of the contact surfaces 40, 52 defines a position of the tablet computer 100 in which it is inclined at an acute angle α, β relative to the setup surface 12, and wherein the tablet computer 100 is inclined at a greater angle α relative to the setup surface 12 in the position defined by the first contact surface 40 than in the position defined by the second contact surface 52.

The invention claimed is:

1. Holding apparatus for a tablet computer (100), having a lower part (14) that spans a setup surface (12) for setting the apparatus up on a table surface and having an upper part (18), which part has a first and a second contact surface (40, 52) for the tablet computer (100), wherein each of the contact surfaces (40, 52) defines a position of the tablet computer (100) in which it is inclined at an acute angle (α, β) relative to the setup surface (12), wherein the first contact surface (40) has two portions (42, 48) disposed at a distance from one another, of which a first portion (42) is the inner surface of a channel (44), and the second portion (48) is disposed at a greater height above the setup surface (12) than the first portion (42), and wherein the tablet computer (100) is inclined at a greater angle (α) relative to the setup surface (12) in the position defined by the first contact surface (40) than in the position defined by the second contact surface (52), wherein the upper part can rotate relative to the lower part (14), about an axis of rotation (16) that runs essentially perpendicular to the setup surface (12), and wherein the holding apparatus further comprises a locking device by means of which the upper part (18) can be locked, relative to the lower part (14), in at least one preferred position.

2. Holding apparatus according to claim 1, wherein the second portion (48) is disposed at a distance of at least 45 mm and at most 60 mm from the first portion (42).

3. Holding apparatus according to claim 1, wherein the second contact surface (52) is formed by an upper delimitation surface of the upper part (18).

4. Holding apparatus according to claim 3, wherein the second contact surface (52) has a length of 50 mm to 80 mm and a width of 60 mm to 100 mm.

5. Holding apparatus according to claim 1, wherein the second contact surface (52) has a slip-preventing rubber element (54).

6. Holding apparatus according to claim 1, further comprising a ball bearing (26) that has a ring (34) provided with balls (28), between the upper part (18) and the lower part (14), disposed at a distance from the upper part (18) and the lower part (14), wherein the balls (28) lie on the lower part (14) and wherein the upper part (18) lies on the balls (28).

7. Holding apparatus according to claim 6, wherein the lower part (14) and the upper part (18) each have a circumferential depression (36, 38) in which the balls (28) are accommodated.

8. Holding apparatus according to claim 1, wherein the locking device has at least one ferromagnetic element (58) in the lower part (14) and at least one ferromagnetic element (60) in the upper part (18), wherein at least one of the ferromagnetic elements (58, 60) is a permanent magnet, and wherein in the at least one preferred position, a ferromagnetic element (60) in the upper part (18) is directly disposed above a ferromagnetic element (58) in the lower part (14), forming a magnetic attraction force.

9. Holding apparatus for a tablet computer (100), having a lower part (14) that spans a setup surface (12) for setting the apparatus up on a table surface and having an upper part (18), which part has a first and a second contact surface (40, 52) for the tablet computer (100), wherein each of the contact surfaces (40, 52) defines a position of the tablet computer (100) in which it is inclined at an acute angle ($\alpha$, $\beta$) relative to the setup surface (12), and wherein the tablet computer (100) is inclined at a greater angle ($\alpha$) relative to the setup surface (12) in the position defined by the first contact surface (40) than in the position defined by the second contact surface (52), wherein the upper part can rotate relative to the lower part (14), about an axis of rotation (16) that runs essentially perpendicular to the setup surface (12), wherein the holding apparatus further comprises a locking device by means of which the upper part (18) can be locked, relative to the lower part (14), in at least one preferred position, and wherein the locking device has at least one ferromagnetic element (58) in the lower part (14) and at least one ferromagnetic element (60) in the upper part (18), wherein at least one of the ferromagnetic elements (58, 60) is a permanent magnet, and wherein in the at least one preferred position, a ferromagnetic element (60) in the upper part (18) is directly disposed above a ferromagnetic element (58) in the lower part (14), forming a magnetic attraction force.

* * * * *